(12) United States Patent
Sanner

(10) Patent No.: US 6,300,844 B1
(45) Date of Patent: Oct. 9, 2001

(54) OSCILLATOR STARTING METHOD

(75) Inventor: Anders Sanner, Saltsjö-Boo (SE)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/487,212

(22) Filed: Jan. 19, 2000

(30) Foreign Application Priority Data

Jan. 20, 1999 (SE) .................................................... 9900156

(51) Int. Cl.[7] .................. H03L 3/00; H03B 5/06
(52) U.S. Cl. ............................................. 331/141; 331/110
(58) Field of Search .................. 331/140, 141, 331/108 R, 109, 110, 111, 112, 113 R, 108 C; 327/129; 379/418

(56) References Cited

U.S. PATENT DOCUMENTS

| | | | |
|---|---|---|---|
| 4,286,233 | * 8/1981 | Kucharewski et al. | 331/111 |
| 4,558,309 | * 12/1985 | Antonewich | 340/649 |
| 4,833,427 | 5/1989 | Leuthold et al. | 331/165 |
| 5,277,495 | * 1/1994 | Forehand | 374/183 |
| 5,870,000 | * 2/1999 | Matsuda et al. | 331/34 |
| 6,072,340 | * 6/2000 | Deisch | 327/100 |

FOREIGN PATENT DOCUMENTS 06120732    4/1994   (JP) .
10290119   10/1998   (JP) .

* cited by examiner

Primary Examiner—Tuan T. Lam
(74) Attorney, Agent, or Firm—Burns, Doane, Swecker & Mathis, L.L.P.

(57) ABSTRACT

The present invention relates to a device for generating a sinewave output signal and comprising an oscillator. The oscillator includes means for respectively connecting and disconnecting one of the device supply voltages, such that when connecting said supply voltage the sinewave output signal will be stabilised after a time period corresponding to an interval of 1–5 periods of the sinewave output signal. The invention also relates to a method of quick-starting a sinewave output signal

6 Claims, 2 Drawing Sheets

OSCILLATOR STARTING METHOD

This application claims priority under 35 U.S.C. §119 and/or 365 to 9900156-2 filed in Sweden on Jan. 20, 1999; the entire content of which is hereby incorporated by reference.

FIELD OF INVENTION

The present invention relates to a method of quick-starting a sinewave oscillator, and to a sinewave oscillator quick-start device according to respective preambles of claims 1 and 6.

DESCRIPTION OF THE BACKGROUND ART

For the purpose of generating an analog telephone ringing signal, there is required a sinewave signal that has a low frequency in the range of 16–60 Hz. In the ringing mode, the actual ringing signal is generated between about 20% and 50% of the time, depending on each individual specification. For instance, a ringing signal will sound for one second, followed by three seconds of silence. In the case of certain short line applications?, where only one to two, or more, analog lines are found, for instance ISDN, some manufacturers use a calling subscriber line circuit referred to as a Subscriber Line Interface Circuit (SLIC). This circuit sends a ringing signal to a telephone, without the use of an external ringing generator and ringing relay. In this construction, the SLIC functions as a path amplifier which is supplied with a sinus signal. The ringing signal is generated by some form of oscillator, e.g. a "Wiener bridge oscillator".

The risk of interference can be reduced and the power consumption of the SLIC kept low when the SLIC is not in a ringing Tnode, by switching-off the oscillator and then starting the oscillator when necessary. Unfortunately, this cannot always be easily achieved since the time lapse from the moment of applying the voltage to the moment at which the sinewave ringing signal is fully developed is very long in comparison with the period time of the ringing signal in the case of that type of precision oscillator which is required to fulfil the requirement of producing a ringing signal of low distortion. It is necessary to start the oscillator at least one second before a fully developed output signal has been obtained, which renders this solution unrealistic in practice. The start time can be shortened, although at the cost of increased distortion—meaning that it is unrealistic in practice.

BACKGROUND OF THE INVENTION

The present invention addresses the problem of how a telephone circuit can be caused to operate with low power consumption in parallel with enabling a sinewave ringing signal to be generated very quickly.

Accordingly, the object of the present invention is to construct an oscillator with which a sinewave ringing signal can be quickly generated, so as to achieve low power consumption and low distortion in a telephone circuit.

The aforesaid problem is solved by the present invention as characterised in the characterising clauses of respective claims 1 and 6.

A quick-start ringing signal can be obtained in an SLIC, by forward biasing one of the connections of the amplifier (output, negative or positive inputs) when no ringing signal is required. This can be achieved, among other things, by disconnecting one of the supply voltages. In the ringing mode, the disconnected supply voltage is reconnected and the oscillator starts when the amplifier begins to work and drives the output to earth.

According to one preferred embodiment an inventive device for generating the sinewave output signal and including an oscillator in accordance with the invention comprises means for engaging and disengaging one of the supply voltages of said device so that the sinewave output signal will be stabilised when connecting said supply voltage after a time period corresponding to an interval of 1–5 periods of the sinewave output signal.

One advantage afforded by the invention is that the sinewave ringing signal from the oscillator can be generated quickly without needing to pre-start the oscillator in order to achieve the desired output signal.

Another advantage afforded by the invention is that the telephone circuit has a lower power consumption when the oscillator is switched-off when not in use.

Another advantage resides in the elimination of an unnecessary noise source, which has its origin in the oscillator, because the oscillator is switched-off when not in use.

The invention will now be described in more detail with reference to preferred embodiments thereof and also with reference to the accompanying drawings.

DESCRIPTION OF PREFERRED EMBODIMENTS

Figure 1:
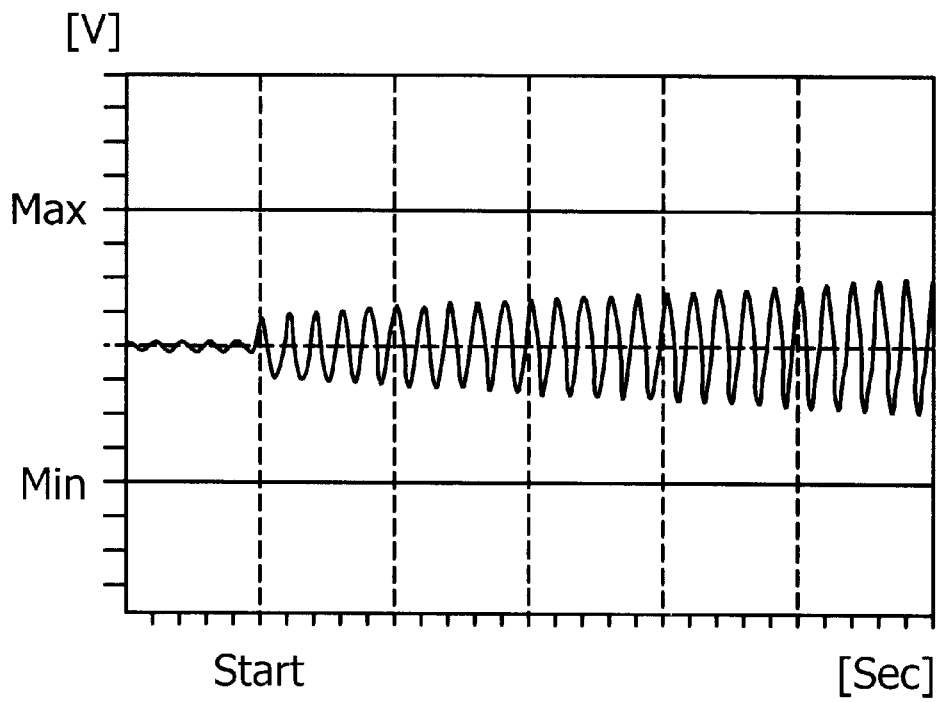
FIG. 1 shows the voltage as a function of time when starting-up a traditional Wien oscillator.

FIG. 1 is a diagrammatic illustration of the voltage as a function of time when starting-up a traditional Wien oscillator. As will be seen from the diagram, a typical time lapse of at least 50 periods occurs from the moment of starting the oscillator to the moment at which the output signal reaches its set point value and has stabilised at this value. It will be readily understood that it is unrealistic to switch the oscillator on and off, since when switched on the oscillator is unable to stabilise before it has to be switched off again.

Figure 2:
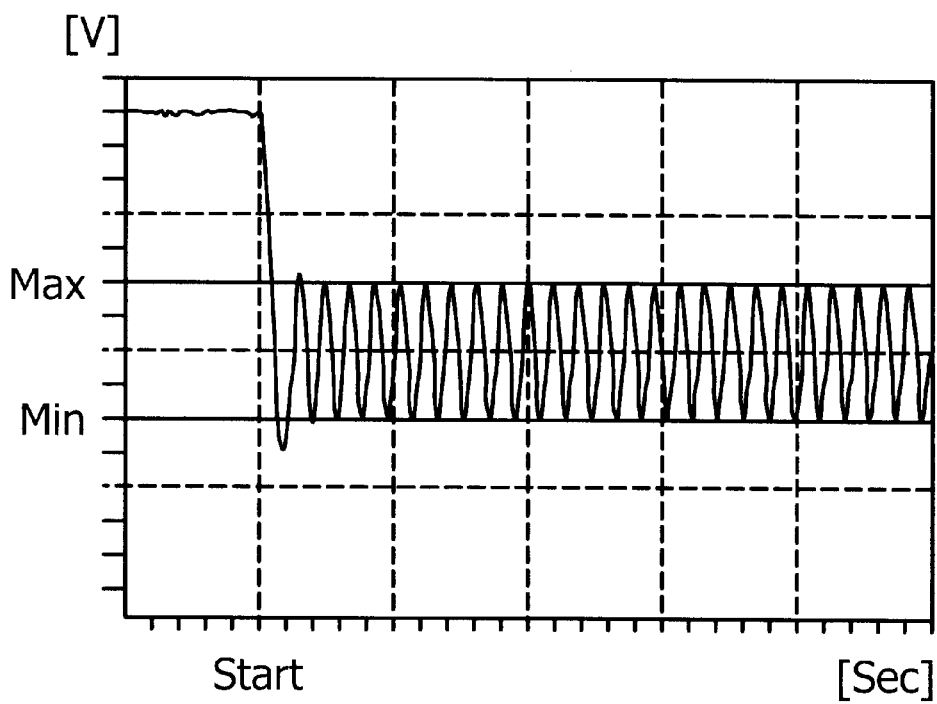
FIG. 2 shows the voltage as a function of time when starting-up an oscillator switch according to the invention.

FIG. 2 is a diagrammatic illustration of the voltage as a function of time when starting-up an inventive oscillator switch. As will be seen from FIG. 2, after having started the oscillator, it takes from between 1–5 periods of the output signal until the signal has been stabilised. Depending on how the word stabilised is defined, i.e. which error or errors can be tolerated in relation to the set-point value of the output signal, it will be seen that the signal is stabilised after about one period in the case of a somewhat greater error, and that the precise set-point value is obtained more or less already after five periods. With an output signal level that lies close to the maximum control of the output, the overshoot decreases, as can be seen immediately after starting the oscillator switch.

Figure 3:
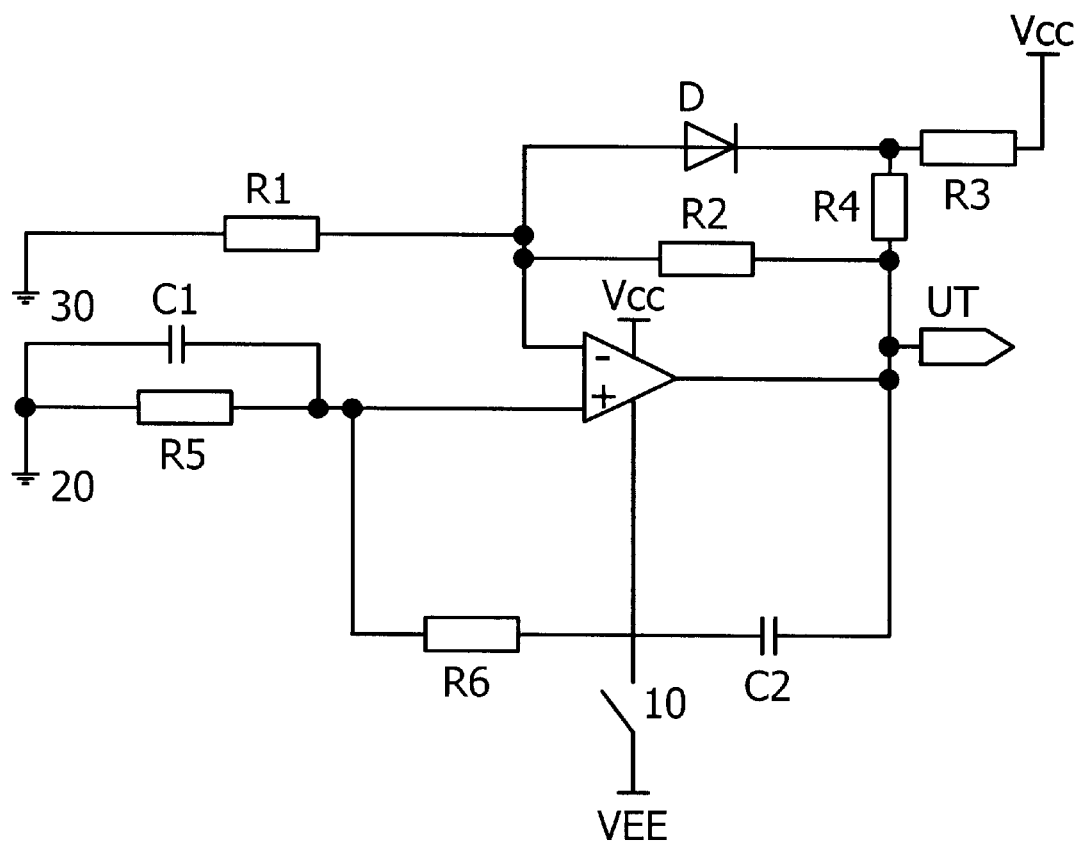
FIG. 3 is a circuit diagram of an inventive quick-start oscillator switch.

FIG. 3 illustrates an example of a Wien-bridge type sinewave oscillator. The oscillator includes an OP-amplifier F, a first resistance R1, a second resistance R2, a third resistance R3, a fourth resistance R4, a fifth resistance R5, a sixth resistance R6, a first and a second capacitance C1 and C2, and a diode D. The illustrated circuit is connected such that a first connection side of the first resistance R1 is connected to earth 30. A second connection side of the first resistance R1 is connected to the negative input of the OP-amplifier, to a first connection side of a second resistance R2, and to the positive side of the diode D. The negative side of the diode D is connected to a first connection side of a third resistance R3 and to a first side of a fourth resistance R4. A second connection side on the third resistance R3 is connected to a positive voltage Vcc. A second connection side on the fourth resistance R4 is connected to a second connection side on the second resistance R2 and to the output of the OP-amplifier. A first connection side on the fifth resistance R5 is connected to earth 20 and to a first connect on side of the capacitance C1. A second connection side on the fifth resistance R5 is connected to a second connection side on the capacitance C1, to a first connection side on the sixth resistance R6, and to the positive input of the OP-amplifier F. A second connection side on the sixth resistance R6 is connected to a first side of the second capacitance C2. A second connection side of the capacitance C2 is connected to the output of the OP-amplifier.

A positive supply voltage Vcc and a negative supply voltage VEE are applied to the OP-amplifier F. A switch 10 is provided between the OP-amplifier F and the negative supply voltage.

The capacitances C1 and C2 and the resistances R5 and R6 determine the oscillation frequency of the circuit. The resistances R1 and R2 determine circuit amplification. The diode D and the resistances R3 and R4 determine the amplitude of the circuit, although they are dependent on the remaining circuit components. The oscillation condition is set by the Barkhausen condition, meaning that the total loop amplification shall be one and the phase shift 0 degrees.

For instance, if the resistances R5 and R6 are each 360 kOhm and each of the capacitances C1 and C2 is chosen as 22 nF, the circuit will oscillate at a frequency of 20 Hz and therewith fulfil one of the requirements for a telephone ringing signal. If R3 and R4 are chosen as 6.8 and 1.1 kOhHm respectively, and R1 is chosen as 10 kOhm, and R2 is chosen as 20 kohm, the circuit will obtain an output voltage corresponding to 1.38 Vrms. The output voltage fulfils one of the requirements for a telephone ringing signal.

When the oscillator is switched off, the switch 10 will be in its OFF-mode shown in FIG. 1. When the oscillator is switched off, or disconnected, the output on the OP-amplifier will lie between earth and the positive supply voltage. When the switch 10 is closed so as to start the oscillator, the amplifier output will be driven towards earth, meaning that the oscillator will start immediately.

The oscillator will assume the correct amplitude already after two periods of the output sinus signal. A so-called amplitude overshoot? can be reduced, by achieving an output signal level that lies close to the maximum control of the output.

Although the switch of the illustrated embodiment has been provided between the negative supply voltage and the OP-amplifier, it will be understood that the switch may be placed in/between other nodes in the construction. This will result in a similar sequence of events as that described above.

The switch 10 may be a semiconductor switch, for instance.

It will be understood that the invention is not restricted to the aforedescribed and illustrated embodiments thereof, and that modifications can be made within the scope of the accompanying Claims.

What is claimed is:

1. An arrangement for quick-starting a sine wave oscillator comprising;

an amplifier having a first and second supply voltage input, and an output for the sine wave;

wherein said first supply voltage input is coupled to a first supply voltage via a switch, and said second supply voltage input is coupled to a second supply voltage;

said second supply voltage being higher than said first supply voltage to keep said output of said amplifier at a DC level between said second supply voltage and a voltage value between said first and said second supply voltages as long as said switch is open;

wherein upon closure of said switch to start said oscillator, said output of said amplifier is driven towards a voltage value between said first and second supply voltages.

2. The arrangement as claimed in claim 1, wherein the voltage value between said first and second supply voltages is earth.

3. The arrangement as claimed in claim 2, wherein said oscillator is of the Wien-bridge type, and said supply voltages are applied to the OP-amplifier of said Wien-bridge oscillator.

4. The arrangement as claimed in claim 2, wherein said switch is a semiconductor switch.

5. A method of quick-starting a sine wave oscillator comprising an amplifier having a first and a second supply voltage input, and an output for the sine wave, said method comprising the steps of:

connecting said first supply voltage input to a first supply voltage via a switch, connecting said second supply voltage input to a second supply voltage that is higher than said first supply voltage to keep the output of said amplifier at a voltage between said second supply voltage and a voltage value between said first and second supply voltages as long as said switch is open, and closing said switch to start the oscillator, whereby the output of said amplifier is driven towards said voltage value between said first and second supply voltages.

6. The method as claimed in claim 5, wherein the voltage value between said first and said second supply voltages is selected to be earth.

* * * * *